(12) United States Patent
Cao et al.

(10) Patent No.: US 7,368,353 B2
(45) Date of Patent: May 6, 2008

(54) TRENCH POWER MOSFET WITH REDUCED GATE RESISTANCE

(75) Inventors: Jianjun Cao, Torrance, CA (US); Paul Harvey, Chepstow (GB); Dave Kent, South Wales (GB); Robert Montgomery, South Glamorgan (GB); Hugo Burke, Wales (GB); Kyle Spring, Temecula, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/981,114

(22) Filed: Nov. 4, 2004

(65) Prior Publication Data

US 2005/0112823 A1 May 26, 2005

Related U.S. Application Data

(60) Provisional application No. 60/517,322, filed on Nov. 4, 2003.

(51) Int. Cl.
*H01L 21/336* (2006.01)

(52) U.S. Cl. ............. 438/270; 438/221; 438/424; 438/212; 438/296; 438/589; 257/E29.257; 257/E21.419; 257/E21.546; 257/E21.629; 257/E21.622

(58) Field of Classification Search .......... 438/270, 438/272, 424, 430, 221, 212, 296, 589; 257/E29.257, 257/E21.419, E21.546, E21.629, E21.622
See application file for complete search history.

(56) References Cited

U.S. PATENT DOCUMENTS

| 5,283,201 A | * | 2/1994 | Tsang et al. ............... 438/138 |
| 5,665,619 A | * | 9/1997 | Kwan et al. ............... 438/270 |
| 6,538,280 B2 | | 3/2003 | Nakamura ................. 257/333 |
| 2004/0185622 A1 | * | 9/2004 | Williams et al. .......... 438/270 |
| 2004/0219752 A1 | * | 11/2004 | Azam et al. ............... 438/270 |
| 2006/0014349 A1 | * | 1/2006 | Williams et al. .......... 438/270 |

\* cited by examiner

*Primary Examiner*—George R. Fourson
*Assistant Examiner*—Julio J Maldonado
(74) *Attorney, Agent, or Firm*—Ostrolenk, Faber, Gerb & Soffen, LLP

(57) ABSTRACT

A method for manufacturing a trench type power semiconductor device which includes process steps for forming proud gate electrodes in order to decrease the resistivity thereof.

7 Claims, 9 Drawing Sheets

US 7,368,353 B2

TRENCH POWER MOSFET WITH REDUCED GATE RESISTANCE

RELATED APPLICATION

This application is based on and claims benefit of U.S. Provisional Application No. 60/517,322, filed Nov. 4, 2003, entitled Trench Power MOSFET With Reduced Gate Resistance, to which a claim of priority is hereby made and the disclosure of which is incorporated by reference.

BACKGROUND OF THE INVENTION

Trench type power semiconductor devices such as power MOSFETs are well known. Referring to FIG. 1, a typical power MOSFET 10 includes a plurality of trenches 12 formed in semiconductor body 14. Semiconductor body 14 is usually a silicon die that includes an epitaxially grown silicon layer (epitaxial silicon layer) 16 of one conductivity (e.g. N-type) formed over a silicon substrate 18 of the same conductivity, but of higher concentration of impurities. A channel region 20 (sometimes referred to as body region) is formed in epitaxial layer 16 and extends from the top surface thereof to a first depth. Channel region 20 is of a conductivity opposite to the epitaxial silicon layer 16 (e.g. P-type) and has formed therein source regions 22 of the same conductivity (e.g. N-type) as epitaxial silicon layer 16. As is well known, trenches 12 extend to a depth below depth of channel region 20 and include gate insulation 24, which may be formed with silicon dioxide, on at least the sidewalls of trenches 12. The bottom of each trench 12 is also insulated with silicon dioxide or the like and a gate electrode 26 is disposed within each trench 12. Gate electrodes 26 are typically composed of conductive polysilicon and may be recessed to a position below the top surface of epitaxial silicon layer 16. A typical trench type power MOSFET further includes a source electrode 28 which is electrically connected to source regions 22 and a high conductivity contact region 30 which is also formed in channel region 20. As is well known, high conductivity contact region 30 is highly doped with dopants of the same conductivity as channel region 30 (e.g. P-type) in order to reduce the contact resistance between source contact 28 and channel region 20. A typical power trench type power MOSFET 10 further includes a drain electrode 32 in electrical contact with silicon substrate 18.

Although not illustrated, gate electrodes 26 are electrically connected to a gate runner, or the like, which serves to electrically connect gate electrodes 26 to a gate contact. Thus, the application of an appropriate voltage to the gate contact changes the voltage of the gate electrodes 26. When the voltage of gate electrodes 26 reaches a threshold value ($V_{TH}$) a channel is formed adjacent each trench 12 in channel region 20, which is of the same conductivity as that of source regions 22 and the region below channel region 20 in epitaxial silicon layer 16 (referred to as drift region). As a result, a current may flow between source electrode 28 and drain electrode 32 of the power MOSFET.

The density of the current that a power MOSFET may accommodate is directly proportional to the number of channels which may be formed per unit area. Thus, the greater the number of trenches per unit area the more current a device can handle. Because of this relationship, designers strive to pack as many trenches 12 as possible for a given die area, which can be accomplished by either reducing the distance between trenches 12 and/or reducing the width of each trench. If the width of trenches 12 is reduced, the width of gate electrodes 26 must also be reduced. However, the reduction of the width of gate electrodes 26 increases the resistance of the gate as a whole, which is undesirable.

FIG. 2 shows an example of a prior art power MOSFET in which gate resistance may be reduced by adding external rims 27 to each gate electrode 26 in order to increase its cross-sectional area. Such a solution, however, increases the overall width of each cell, and thus is not desirable if increasing cell density is desirable.

SUMMARY OF THE INVENTION

To overcome the drawbacks of the prior art and increase the cell density of a trench type power semiconductor device gate electrodes of the device are manufactured to become "proud" of the gate trenches. Consequently, the resistance of the gate and Qgd/Qgs are reduced. In addition, shallower source regions may be obtained.

In a process according to the present invention, the hard mask used to form trenches in a semiconductor body is left in place and the gate electrodes are formed to reach the free surface of the hard mask. The hard mask is then removed to leave "proud" gate electrodes, i.e. gate electrodes above the surface of the semiconductor body.

Optionally, the process includes a step for siliciding or saliciding the gate electrodes to improve the gate resistance.

In an alternative embodiment, in addition to siliciding the gate electrodes, portions of the source regions are silicided. It is believed that by siliciding portions of the source region the contact resistance between source metal and source regions may be decreased, which may improve the avalanche performance of the device.

Other features and advantages of the present invention will become apparent from the following description of the invention which refers to the accompanying drawings.

DETAILED DESCRIPTION OF THE FIGURES

Figure 1:
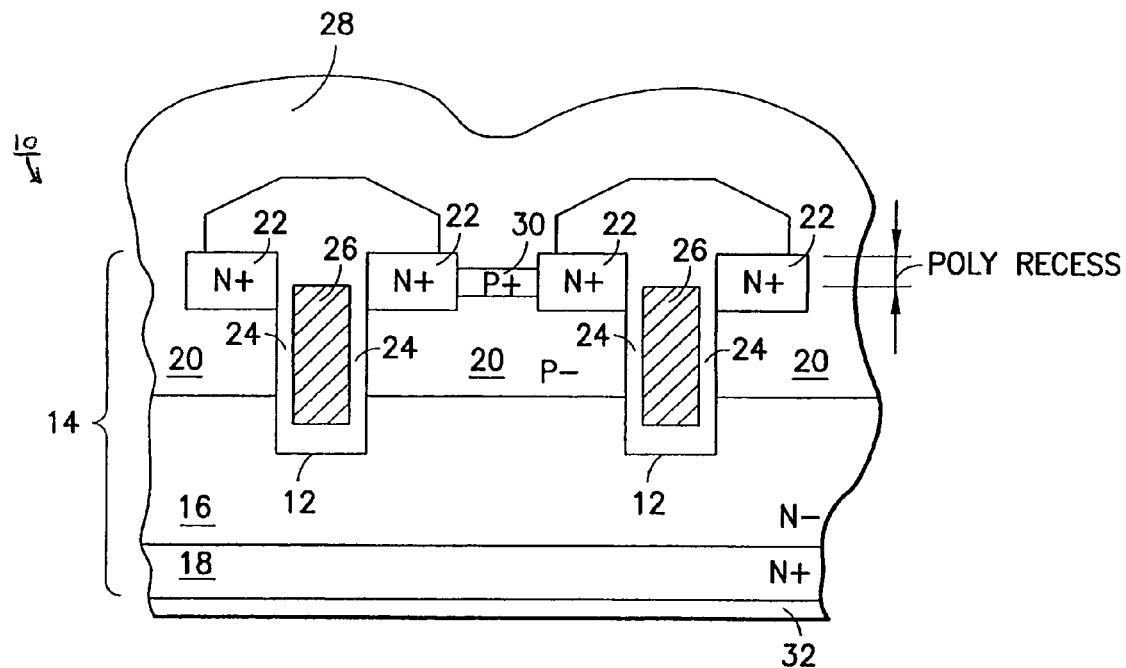
FIG. 1 shows a cross-sectional view of a trench type power MOSFET according to the prior art.
Figure 2:
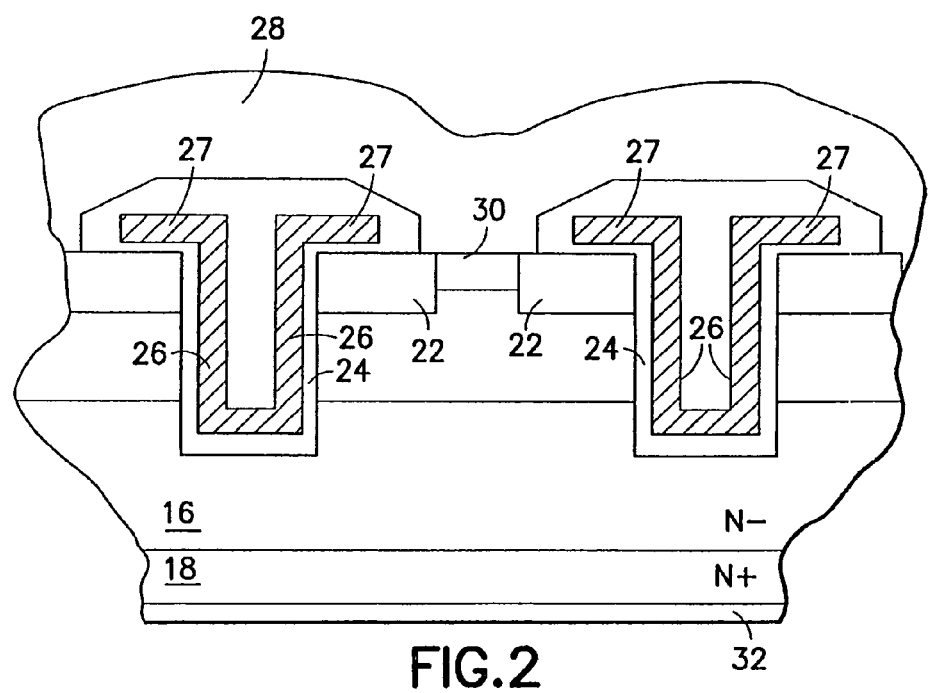
FIG. 2 shows a cross-sectional view of a trench type power MOSFET according to the prior art.
Figure 3:
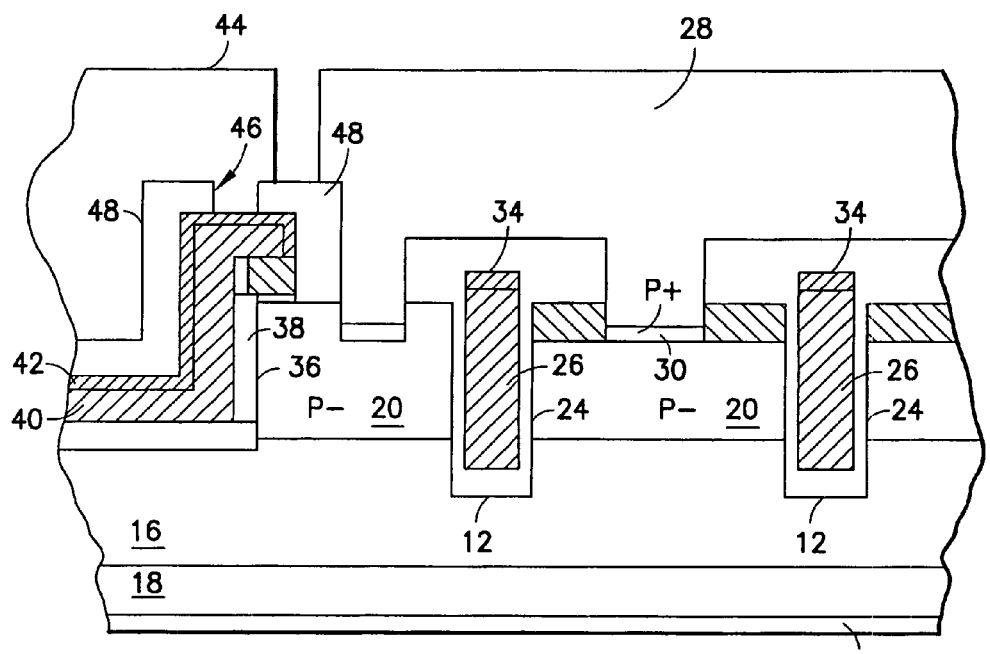
FIG. 3 shows a cross-sectional view of a trench type power MOSFET manufactured in a process according to the first embodiment of the present invention.

Referring to FIG. 3, a power MOSFET according to the first embodiment of the present invention includes "proud" gate electrodes 26. That is, a power MOSFET according to the present invention includes gate electrodes 26 which extend out of trenches 12 and above the top surface of epitaxial silicon layer 16. By extending gate electrodes 26 outside of trenches 12, the overall gate resistance may be reduced.

To further reduce gate resistance, the free end of each gate electrode 26 may be silicided. That is, the free end of each gate electrode 26 may include a silicided portion 34.

A power MOSFET according to the first embodiment of the present invention may further include a trench type termination structure. The trench type termination structure includes termination trench 36, which extends to a depth below that of channel region 20, and surrounds the active area (the area containing trenches 12) of the device. The termination structure further includes field oxide 38 which is disposed over the sidewall and the bottom of termination trench 36, and field relief electrode 40 which is formed over field oxide 38. Field relief electrode 40 is preferably formed from conductive polysilicon and includes a silicided portion 42. Silicided portion 42 is in electrical contact with a field plate 44 through a gap 46 in insulation body 48.

Figure 4A:
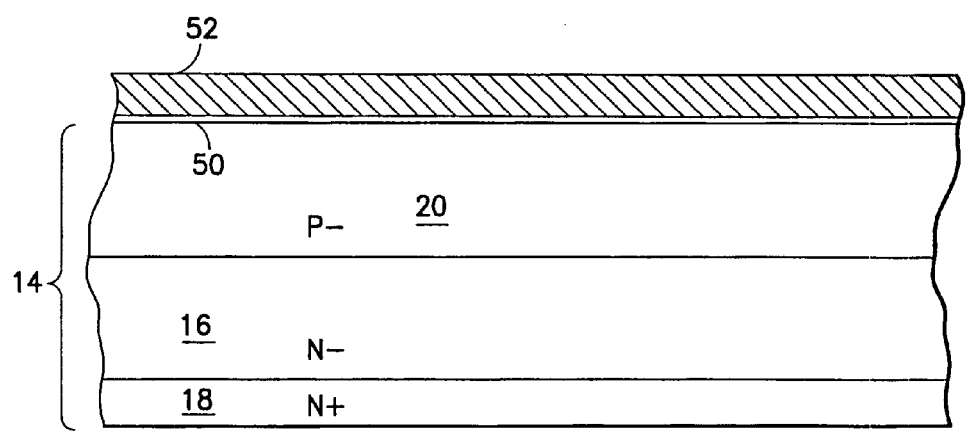
FIGS. 4A-4I graphically illustrate a process according to the first embodiment of the present invention.

Referring now to FIG. 4A, according to the first embodiment of the present invention, a first surface of the semiconductor body 14 is covered with a pad oxide layer 50, and a hard mask layer 52, which is preferably composed of $Si_3N_4$. Semiconductor body 14 preferably includes a silicon substrate 18 of one conductivity (e.g. N-type), and epitaxial silicon layer 16 of the same conductivity (e.g. N-type) grown over one major surface of silicon substrate 18. As is well known, epitaxial silicon layer 16 includes a lower concentration of dopants compared to that of substrate 18. It should also be noted that a channel region 20 of a conductivity opposite to that of epitaxial silicon layer 16 may be formed therein by implanting dopants of the opposite conductivity (e.g. P-type) and driving the same in a diffusion drive to a desired channel depth. Alternatively, a channel region may be epitaxially grown.

Figure 4B:
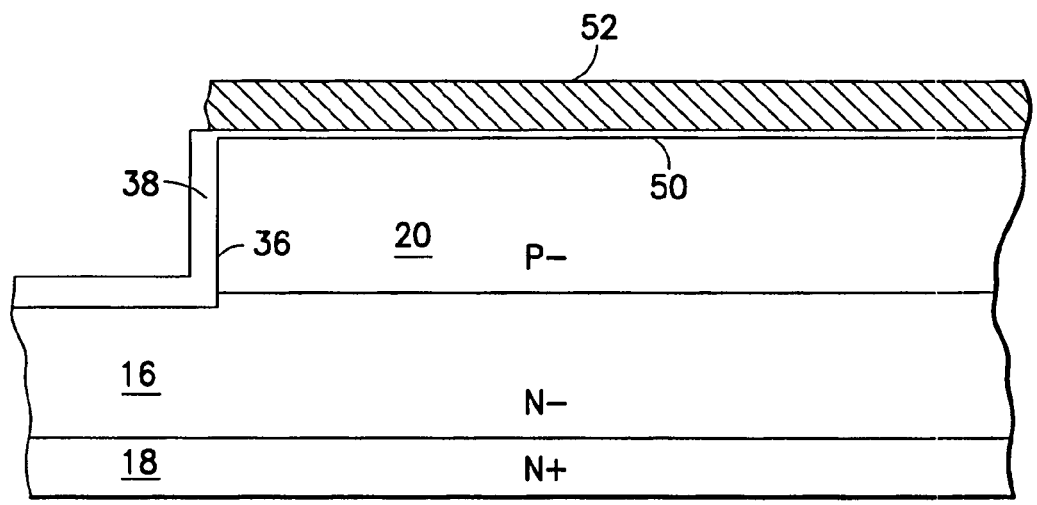

Referring next to FIG. 4B, termination trench 36 is formed by etching a groove into epitaxial silicon 16 to a depth below channel region 20. To form termination trench 36 a conventional photolithographic step may be employed. After termination trench 36 is formed field oxide 38 is grown over the sidewall and the bottom of trench 36. It should be noted that because hard mask 52 is composed of $Si_3N_4$, only the sidewall and the bottom of termination trench 36 are oxidized in that $Si_3N_4$ is an oxidation retardant.

Figure 4C:
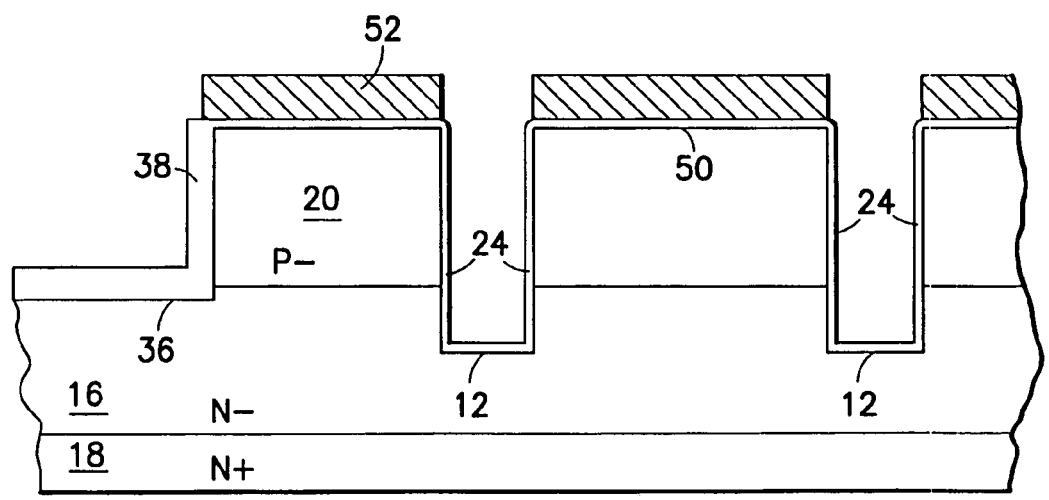

Referring next to FIG. 4C, appropriate masking and etching steps are carried out to form trenches 12. Thereafter, the sidewalls and the bottom of trenches 12 are oxidized to form gate insulation layers 24. It should be noted that this step may be varied to obtain a thicker oxide at the bottom of trenches 12 than at the sidewalls thereof using any of the known techniques, or the oxide at the bottom of trenches 12 may be the same thickness as gate insulation layers 24. Because hard mask 52 is composed of $Si_3N_4$ only the sidewalls and the bottom of trenches 12 are oxidized in the oxidation step.

Figure 4D:
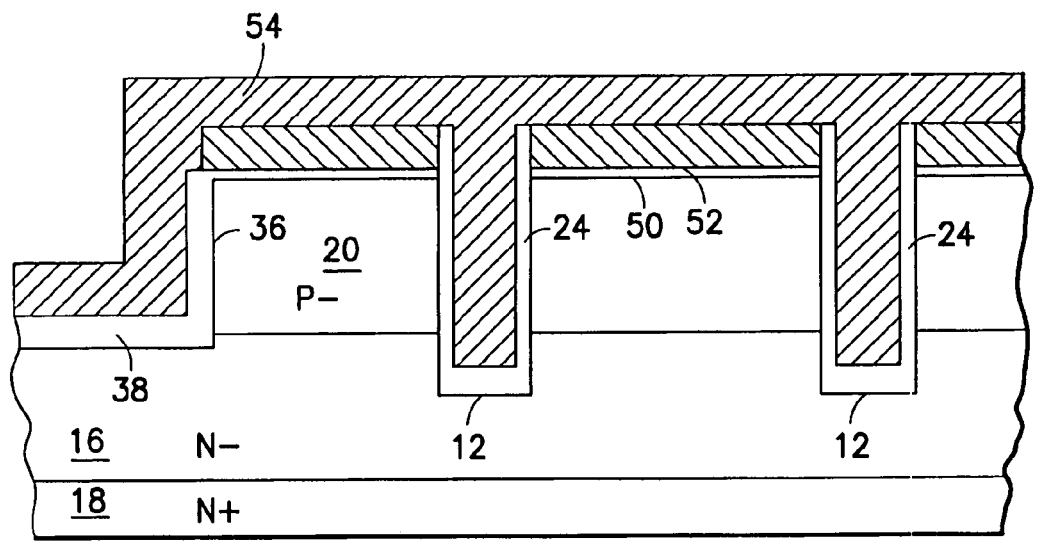
Figure 4E:
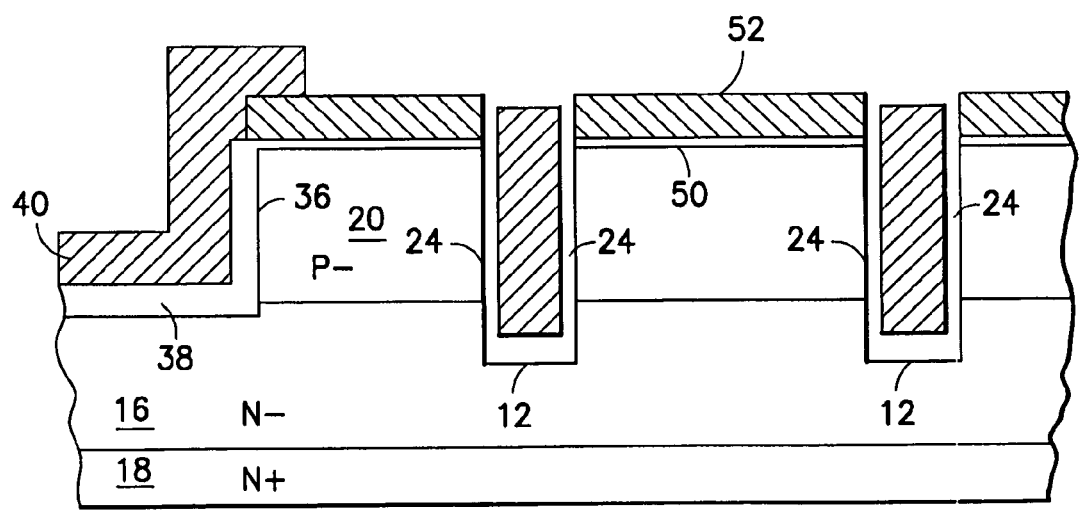

Referring next to FIG. 4D, polysilicon 54 is deposited to fill trenches 12, and cover hard mask 52 and field oxide 38 in termination trench 36. Thereafter, portions of polysilicon 54 are removed by appropriate masking and etching leaving field relief electrode 40 over field oxide 38 in termination trench 36, and gate electrodes 26 in trenches 12 as illustrated by FIG. 4E.

Figure 4F:
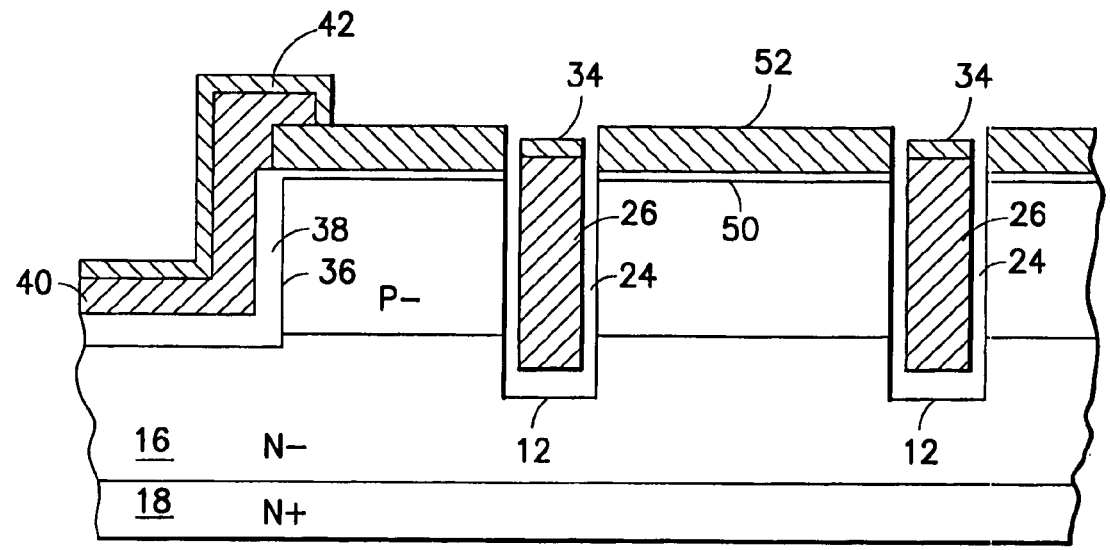

Referring next to FIG. 4F, if desired, as an option, the top ends of gate electrodes 26 and exposed top portion of field relief electrode 40 can be silicided or salicided to improve the resistive value of the same. Thus, for example, a layer of siliciding metal such as titanium, cobalt or nickel is deposited over the polysilicon and over hard mask 52, and annealed. The siliciding metal reacts with the polysilicon and silicides portions of the same. Thereafter, the unreacted portion of the siliciding metal is removed. After the siliciding step, hard mask 52 and pad oxide 50 are removed and a source implant is carried out to form source implant regions 53 in channel region 20 between trenches 12. The result of which is illustrated by FIG. 4G.

Figure 4G:
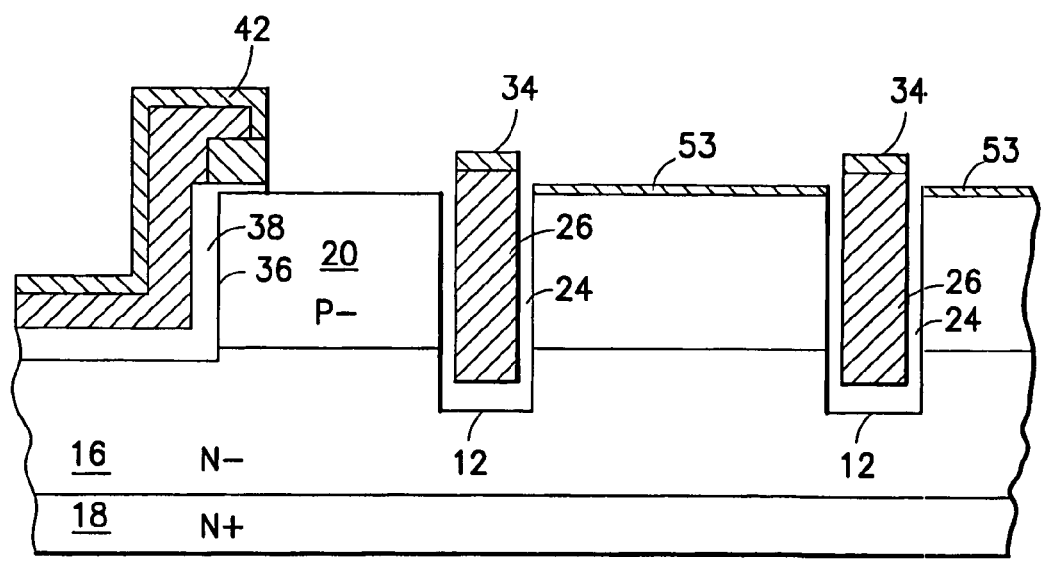
Figure 4H:
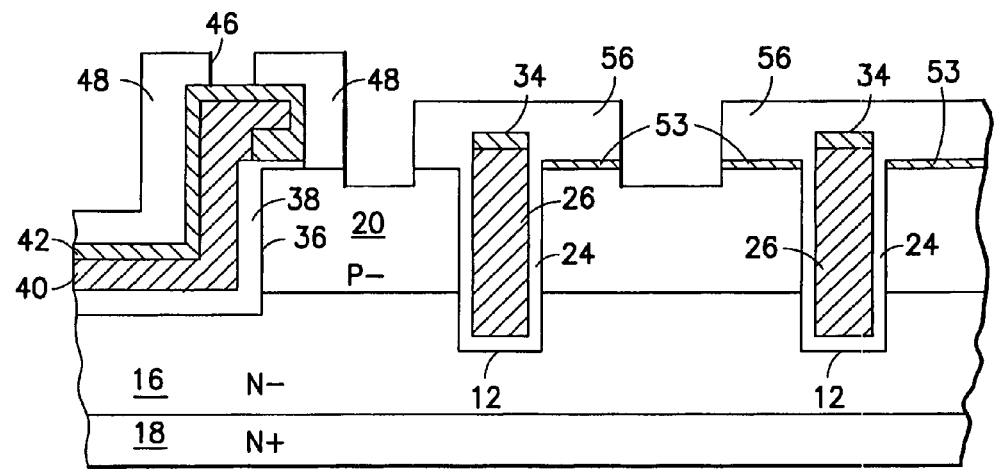
Figure 4I:
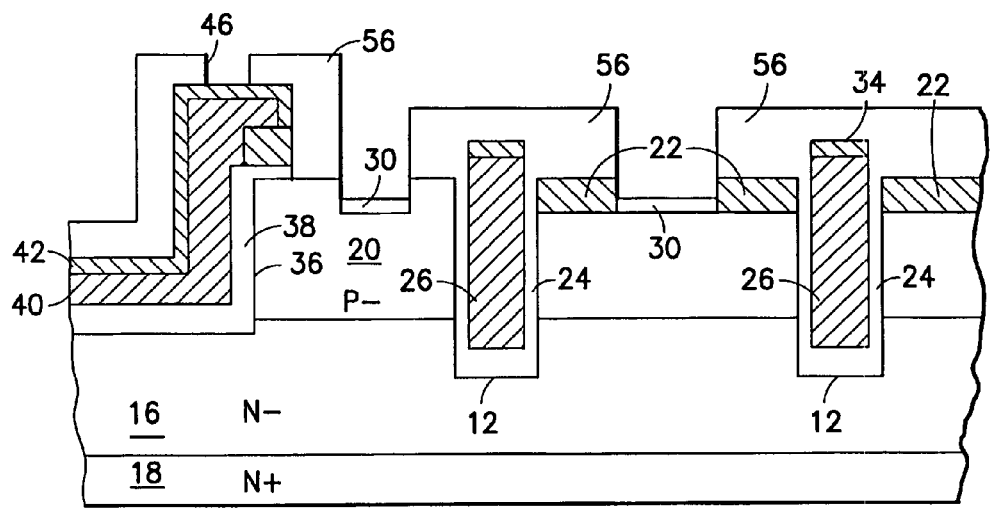

Referring next to FIG. 4H, an oxide layer composed, for example, from TEOS, is formed over the structure shown in FIG. 4G, and with appropriate masking and etching portions of the oxide layer are removed leaving oxide interlayers 56 over gate electrodes 24 and insulation body 48 over field relief electrode 40. Note that insulation body 48 over field relief electrode 40 is also etched in the same step to include gap 46. Furthermore, it should also be noted that the etch step also removes a portion of epitaxial silicon 16 until channel region 20 is reached through source implant region 53. Next, dopants of the same conductivity as channel region 20 are implanted in channel region 20 and after a diffusion drive, source regions 22 and high conductivity contact regions 30 are obtained as illustrated by FIG. 4I. Thereafter, front metal and back metal are applied using known methods to obtain source contact 28, field plate 44 and drain contact 32 (FIG. 3).

Figure 5A:
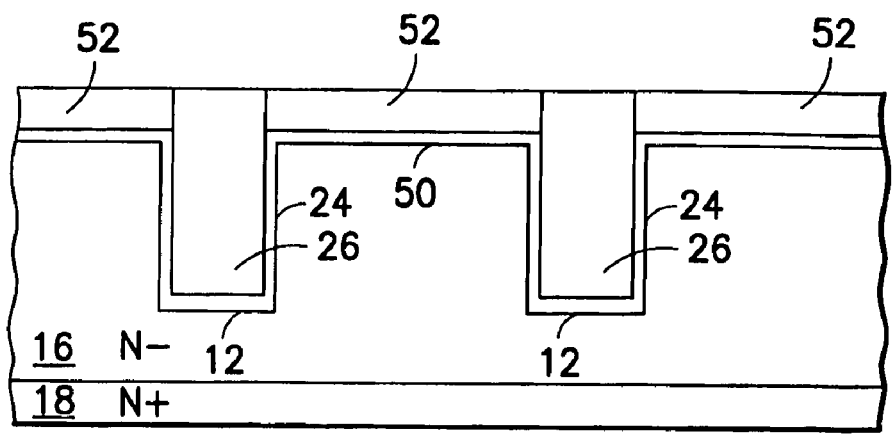
FIG. 5A-5G graphically illustrate a process according to the second embodiment of the present invention.
Figure 5B:
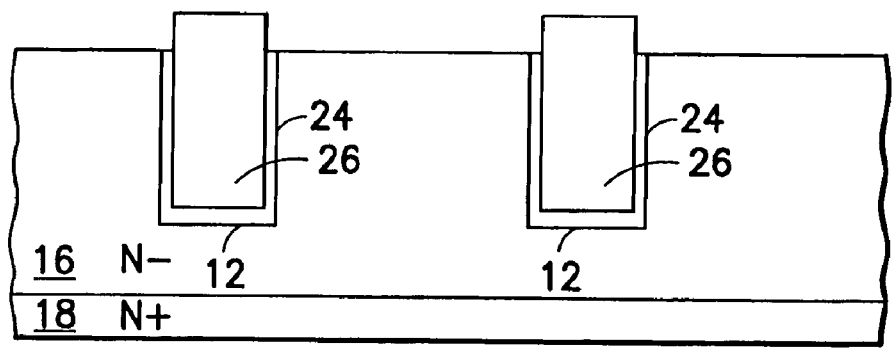
Figure 5C:
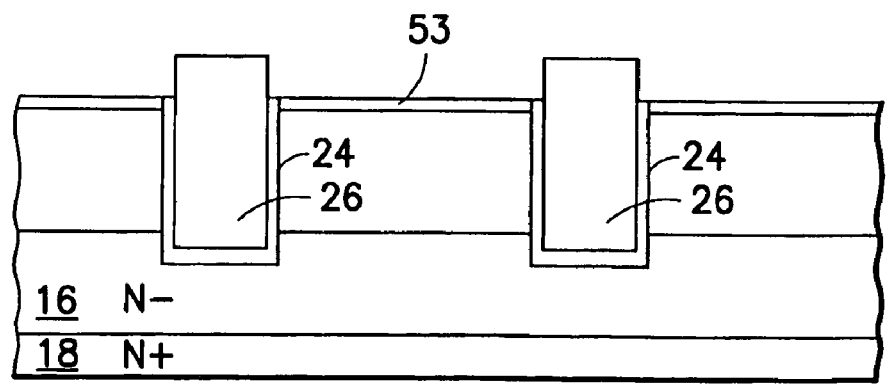
Figure 5D:
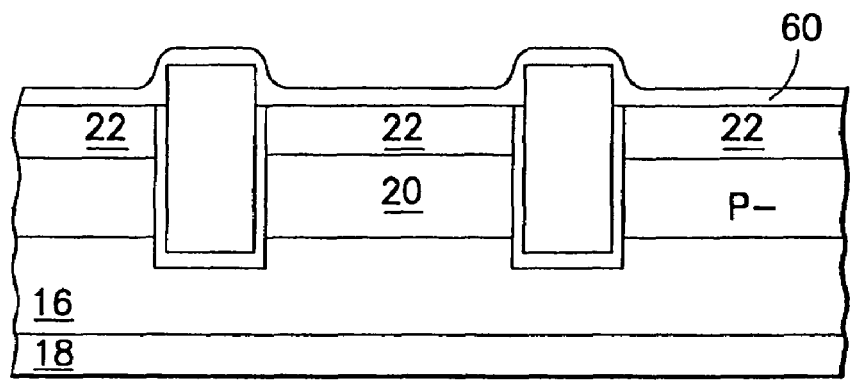

Referring now to FIG. 5A, in a second embodiment, channel region 20 is not formed in epitaxial silicon layer 16 prior to forming gate electrodes 26 in trenches 12. Otherwise, the process is the same as that described with reference to FIGS. 4A-4E. Thus, once gate electrodes 26 are formed in trenches 12, hard mask 52 and pad oxide 50 are removed by etching to obtain "proud" gate electrodes as seen in FIG. 5B. Thereafter, P-type dopants are implanted and driven to a desired depth to form channel region 20. N-type dopants are implanted to form source implant region 53 as shown in FIG. 5C. Thereafter, an insulation layer 60, which is preferably composed of a low temperature oxide such as TEOS, is formed to obtain a structure such as the one illustrated in FIG. 5D.

Figure 5E:
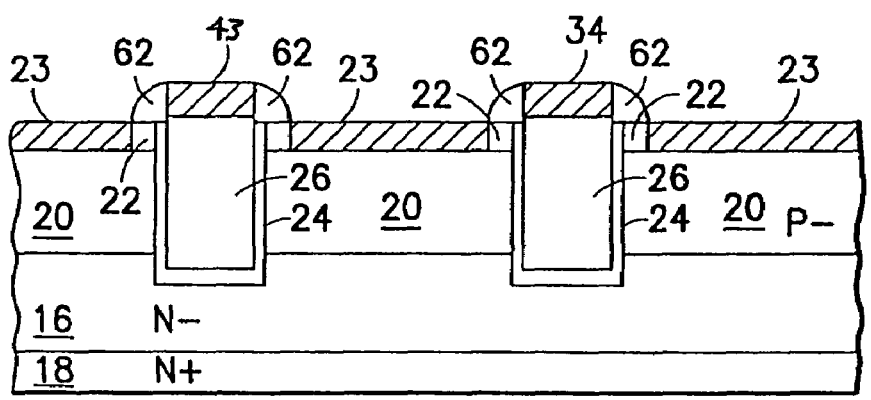

Referring next to FIG. 5E, portions of insulation layer 60 are removed by etching or the like to form spacers 62 on the sidewalls of the "proud" portion of gate electrodes 26, leaving the top portion of the same free. Next, a layer of titanium, cobalt, nickel or the like is deposited over the exposed surfaces of epitaxial silicon layer 16, and top free surfaces of gate electrode 26. Thereafter, an annealing step is carried out whereby the top free portions of gate electrodes 26 and source region 22 are silicided. As a result, top free portion of each gate electrode 26 includes a silicided portion 43 and a portion 23 of source region 22 are silicided.

Figure 5F:
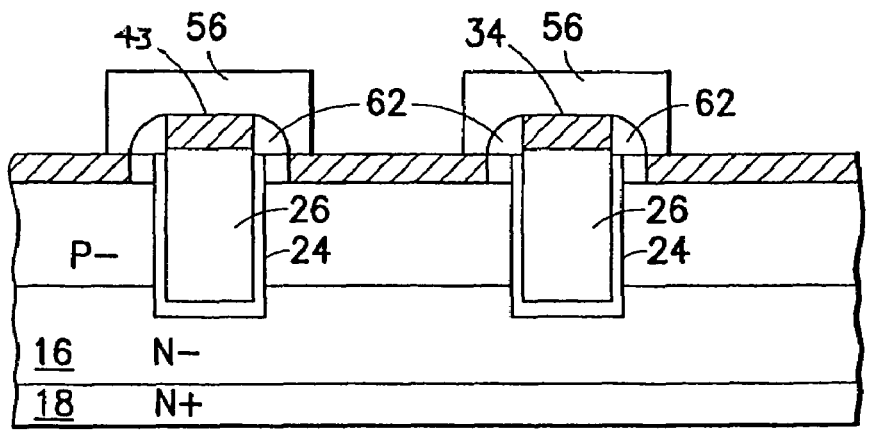
Figure 5G:
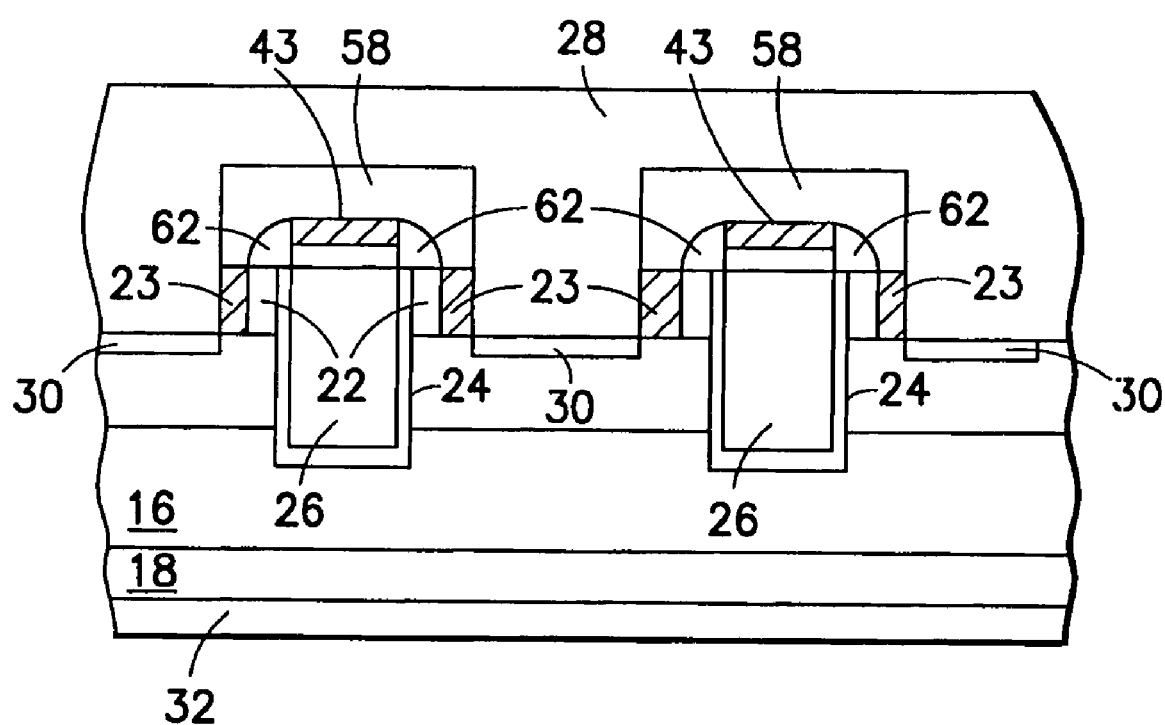

Referring next to FIG. 5F, another insulation layer which is preferably composed of TEOS or the like, is deposited and etched to form insulation interlayers 56. Next, the silicon not covered by insulation interlayers 56 is removed until at least channel region 20 is reached. Next, high conductivity contact regions 30 are formed in channel region 20, and source contact 28, and drain contact 32 are formed as previously described to obtain a device as illustrated by FIG. 5G.

In an alternative embodiment, high conductivity contact region 30 may be formed first, and then silicidation can be carried out.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for manufacturing a power semiconductor device comprising:
   forming a mask layer over a first surface of a semiconductor body;
   patterning said mask layer with a plurality of openings each opening extending to and exposing said first surface of said semiconductor body at the bottom thereof;

etching a termination trench in said semiconductor body prior to patterning said mask layer, said termination trench including a side wall and bottom, extending to a depth below a first depth and defining an active area that includes said trenches:

defining trenches in said semiconductor body by etching said semiconductor body through said openings, each trench including sidewalls and a bottom;

forming an insulation layer on said sidewalls of said trenches;

forming a gate electrode in each of said trenches, each gate electrode including a free end extending above said first surface into a respective opening in said mask layer to a height substantially co-planar with a top surface of said mask layer;

siliciding each of said gate electrodes at its free end;

removing said mask layer, whereby each gate electrode becomes proud and extends above said first surface of said semiconductor body;

implanting continuous source implant regions of first conductivity in said semiconductor body between said trenches;

forming spaced insulation interlayers over said free ends of said gate electrodes;

etching through said source implant regions;

implanting regions of second conductivity into said semiconductor body through spaces between said spaced interlayers to form implant regions of said second conductivity; and applying a diffusion drive to form source regions and high conductivity contact regions of said second conductivity.

2. A method according to claim 1, wherein said mask layer is comprised of silicon nitride.

3. A method according to claim 1, wherein said gate electrodes are formed by first forming gate electrode material inside said trenches and over said mask layer and then removing gate electrode material that overlies said mask layer.

4. A method according to claim 1, further comprising forming a channel region of a second conductivity in said semiconductor body, said channel region extending to a first depth; and wherein said source regions are formed in said channel region and terminate at a depth shallower than said first depth.

5. A method according to claim 1, wherein said source regions are formed in said channel region and extend to a depth that is shallower than said first depth.

6. A method for manufacturing a power semiconductor device comprising:

forming a mask layer over a first surface of a semiconductor body;

patterning said mask layer with a plurality of openings each opening extending to and exposing said first surface of said semiconductor body at the bottom thereof;

defining trenches in said semiconductor body by etching said semiconductor body through said openings, each trench including sidewalls and a bottom;

forming an insulation layer on said sidewalls of said trenches;

forming a gate electrode in each of said trenches, each gate electrode including a free end extending above said first surface into a respective opening in said mask layer to a height substantially co-planar with a top surface of said mask layer;

siliciding each of said gate electrodes at its free end;

removing said mask layer, whereby each gate electrode becomes proud and extends above said first surface of said semiconductor body;

implanting continuous source implant regions of first conductivity in said semiconductor body between said trenches;

forming spaced insulation interlayers over said free ends of said gate electrodes;

etching through said source implant regions;

implanting regions of second conductivity into said semiconductor body through spaces between said spaced interlayers to form implant regions of said second conductivity; and applying a diffusion drive to form source regions and high conductivity contact regions of said second conductivity; forming a channel region of a second conductivity in said semiconductor body to a first depth within said semiconductor body, said trenches extending to a depth below said first depth; and etching a termination trench in said semiconductor body prior to patterning said mask layer, said termination trench including a side wall and bottom, extending to a depth below said first depth and defining an active area that includes said trenches; forming a field insulation body over said sidewall and said bottom of said termination trench; forming an electrically conductive layer over said field insulation and said mask layer; and etching said electrically conductive layer that overlies said mask layer to define a termination electrode in said termination trench.

7. A method according to claim 6, further comprising siliciding said termination electrode.

* * * * *